(12) United States Patent
Alameh et al.

(10) Patent No.: US 11,162,302 B2
(45) Date of Patent: *Nov. 2, 2021

(54) DEVICE FOR GENERATING ELECTRIC ENERGY

(71) Applicant: TROPIGLAS TECHNOLOGIES LTD, Yokine (AU)

(72) Inventors: Kamal Alameh, Rivervale (AU);
Victor Rosenberg, Yokine (AU);
Mikhail Vasiliev, Quinns Rocks (AU)

(73) Assignee: TROPIGLAS TECHNOLOGIES LTD, Yokine (AU)

(*) Notice: Subject to any disclaimer, the term of this patent is extended or adjusted under 35 U.S.C. 154(b) by 0 days.

This patent is subject to a terminal disclaimer.

(21) Appl. No.: 16/600,863

(22) Filed: Oct. 14, 2019

(65) Prior Publication Data

US 2020/0040653 A1 Feb. 6, 2020

Related U.S. Application Data

(63) Continuation of application No. 14/912,684, filed as application No. PCT/AU2014/000814 on Aug. 15, 2014, now Pat. No. 10,988,978.

(30) Foreign Application Priority Data

Aug. 19, 2013 (AU) .............................. 2013903127
Nov. 5, 2013 (AU) .............................. 2013904275
(Continued)

(51) Int. Cl.
*E06B 9/24* (2006.01)
*H01L 31/05* (2014.01)
(Continued)

(52) U.S. Cl.
CPC ............ *E06B 9/24* (2013.01); *G02F 1/13306* (2013.01); *H01L 31/0443* (2014.12);
(Continued)

(58) Field of Classification Search
CPC . H02S 40/36; H02S 40/30–34; H01L 31/055; H01L 31/02322; H01L 31/02325; H01L 31/0547
See application file for complete search history.

(56) References Cited

U.S. PATENT DOCUMENTS 4,144,097 A 3/1979 Chambers et al.
4,149,902 A 4/1979 Mauer et al.
(Continued)

FOREIGN PATENT DOCUMENTS

DE 102007058971 6/2009
FR 2524716 A1 * 10/1983 ............ H02S 30/10
(Continued)

OTHER PUBLICATIONS

Notification of Transmittal of International Preliminary Report on Patentability for International Application No. PCT/AU2014/000814 dated Jul. 22, 2015 (15 pages).
(Continued)

*Primary Examiner* — Eric R Smith
(74) *Attorney, Agent, or Firm* — Michael Best & Friedrich LLP

(57) ABSTRACT

The present disclosure provides a device for generating electric energy. The device comprises a panel that is at least partially transmissive for visible light. The panel has a receiving surface for receiving incident light and is arranged such that a portion of the incident light is redirected towards regions that are at edges or side portions of the panel. The device further comprises a plurality of photovoltaic elements positioned at or in the proximity of the edges or side portions
(Continued)

of the panel. Each of the plurality of photovoltaic elements is electrically parallel connected to another one of the plurality of photovoltaic elements and the device is arranged to generate the electricity from at least a portion of the redirected incident light.

20 Claims, 16 Drawing Sheets

(30) Foreign Application Priority Data

| | | |
|---|---|---|
| Dec. 18, 2013 | (AU) | 2013904952 |
| May 22, 2014 | (AU) | 2014901915 |
| May 22, 2014 | (AU) | 2014901916 |

(51) Int. Cl.
| | |
|---|---|
| *H01L 31/0443* | (2014.01) |
| *H02S 30/10* | (2014.01) |
| *G02F 1/133* | (2006.01) |
| *H01L 31/048* | (2014.01) |
| *H01L 31/054* | (2014.01) |
| *H02S 40/22* | (2014.01) |

(52) U.S. Cl.
CPC ...... *H01L 31/0488* (2013.01); *H01L 31/0504* (2013.01); *H01L 31/0547* (2014.12); *H01L 31/0549* (2014.12); *H02S 30/10* (2014.12); *H02S 40/22* (2014.12); *E06B 2009/2464* (2013.01); *G02F 1/13324* (2021.01); *Y02E 10/52* (2013.01)

(56) References Cited

U.S. PATENT DOCUMENTS

| | | | |
|---|---|---|---|
| 4,644,716 | A | 2/1987 | Neuroth |
| 8,337,039 | B1 | 12/2012 | Larkin |
| 2008/0223438 | A1 | 9/2008 | Xiang et al. |
| 2009/0032083 | A1 | 2/2009 | Torrance et al. |
| 2009/0056791 | A1 | 3/2009 | Pfenninger et al. |
| 2009/0255568 | A1 | 10/2009 | Morgan |
| 2010/0154865 | A1 | 6/2010 | Oh et al. |
| 2010/0281721 | A1* | 11/2010 | Chen .................. G09F 15/0037 40/541 |
| 2011/0079271 | A1 | 4/2011 | Dets |
| 2011/0192446 | A1 | 8/2011 | Kawai et al. |
| 2011/0226332 | A1 | 9/2011 | Ford et al. |
| 2012/0125435 | A1 | 5/2012 | Maeda |
| 2012/0055564 | A1 | 8/2012 | Gravisse et al. |
| 2013/0233372 | A1* | 9/2013 | Azumada ............. H01L 31/055 136/247 |
| 2013/0247954 | A1 | 9/2013 | Kunz |
| 2015/0162474 | A1 | 6/2015 | Uchida et al. |
| 2015/0194555 | A1 | 7/2015 | Zhang et al. |
| 2015/0206987 | A1* | 7/2015 | Ohhashi ............. H01L 31/0547 136/246 |

FOREIGN PATENT DOCUMENTS

| | | |
|---|---|---|
| JP | 2013038323 | 2/2013 |
| KR | 2010-0027728 A | 3/2010 |
| KR | 2012-0004264 A | 1/2012 |
| WO | 2012055976 | 5/2012 |
| WO | 2012063651 | 5/2012 |

OTHER PUBLICATIONS

International Search Report and Written Opinion for International Application No. PCT/AU2014/000814 dated Nov. 4, 2014 (10 pages).

Chen, RT. "Design and fabrication of diffusive solar cell window" Renewable Energy, vol. 40, Issue 1, Apr. 2012, pp. 24-28.

Extended European Search Report for Application No. 14838717.8 dated Jul. 21, 2016 (6 pages).

* cited by examiner

DEVICE FOR GENERATING ELECTRIC ENERGY

FIELD OF THE INVENTION

The present invention relates to a device for generating electric energy and relates particularly, though not exclusively, to a device comprising a photovoltaic element.

BACKGROUND OF THE INVENTION

Overheating of interior spaces, such as spaces that receive sunlight through large windows, is a problem that may be overcome using air conditioners. A large amount of energy is globally used to cool interior spaces. The majority of electrical energy is generated using non-sustainable sources, which is of increasing environmental concern.

PCT international applications numbers PCT/AU2012/000778 and PCT/AU2012/000787 (both owned by the present applicant) disclose a spectrally selective panel that may be used as a windowpane and that is largely transmissive for visible light, but diverts a portion of incident light to side portions of the panel where it is absorbed by photovoltaic elements to generate electricity.

The present invention provides further improvements.

SUMMARY OF THE INVENTION

In a first aspect of the present invention there is provided a device for generating electric energy, the device comprising:
a panel that is at least partially transmissive for visible light, the panel having a receiving surface for receiving incident light and being arranged such that a portion of the incident light is redirected towards regions that are at edges of the panel; and
a plurality of photovoltaic elements comprising a first and a second photovoltaic element that are positioned at or in the proximity of the same edge of the panel, the first photovoltaic element having an orientation relative to the receiving surface of the panel that is different to an orientation of the second photovoltaic element relative to the receiving surface of the panel;
wherein one of the first and second photovoltaic elements is positioned to receive light that is redirected through the edge of the panel and the other photovoltaic element is positioned to receive light that is redirected through an area in the proximity of the edge; and
wherein the device is arranged to generate the electricity from at least a portion of the redirected light.

Throughout this specification the term "photovoltaic element" is used for a single photovoltaic cells or photovoltaic modules that may comprise a plurality of series connected single photovoltaic cells.

In one embodiment of the present invention the first photovoltaic element is facing the edge and arranged to receive light that is redirected through the edge and the second photovoltaic element is positioned adjacent the edge and facing a surface portion that is parallel or oriented along the receiving surface of the panel to receive light that is redirected through the area in the proximity of the edge.

The first and second photovoltaic elements may be oriented along that same edge of the panel. Further, the first and second photovoltaic elements may be electrically parallel connected to each other. The first photovoltaic element may be oriented along that edge of the panel and may be substantially perpendicular to the receiving surface of the panel. The second photovoltaic element may also be oriented at or along that edge of the panel, but may be substantially parallel and over, or parallel and below, the receiving surface of the panel.

The panel may have a plurality of edges and the first photovoltaic element may be one of a plurality of photovoltaic elements that are positioned at different edges and also the second photovoltaic element may be one of a plurality of photovoltaic elements that are positioned at different edges.

In a second aspect of the present invention there is provided a device for generating electric energy, the device comprising:
a panel that is at least partially transmissive for visible light, the panel having a receiving surface for receiving incident light and being arranged such that a portion of the incident light is redirected towards regions that are at edges or side portions of the panel; and
a plurality of photovoltaic elements positioned at or in the proximity of the edges or side portions of the panel;
wherein each of the plurality of photovoltaic elements is electrically parallel connected to another one of the plurality of photovoltaic elements and the device is arranged to generate the electricity from at least a portion of the redirected incident light.

At least two of the photovoltaic elements may be positioned at or in the proximity of the same edge or side portion of the panel. The at least two photovoltaic elements may be oriented along the same edge or side portion of the panel.

Alternatively, at least two of the photovoltaic elements may be positioned at or in the proximity of respective edges or side portions of the panel.

At least two of the photovoltaic elements may be positioned such that each receiving plane of the at least two photovoltaic elements has a different orientation relative to the panel. Alternatively or additionally, at least two of the photovoltaic elements may be positioned such that each receiving plane of the at least two photovoltaic elements has the same orientation relative to the panel.

The following introduces features that the invention in accordance with either of the first aspect or the second aspect may have.

The frame structure may comprise a support for supporting photovoltaic elements at or in the proximity of the edge portion of the panel. At least one further photovoltaic element may also be positioned on the frame structure and arranged to collect light that is directed towards the frame structure.

In one specific embodiment the panel has a component that is arranged such that at least a portion of light that is incident on the panel is redirected by the component into at least one direction that is transversal to a surface normal of the panel.

The frame structure may comprise a holder for holding at least one photovoltaic element and that is arranged such that the at least one photovoltaic element is replaceable. Further, the frame structure may be arranged such that the panel is replaceable without replacing the at least one photovoltaic element.

The panel may have projections that project within a plane of the panel and at which the frame structure supports the spectrally selective panel. At least one photovoltaic element may be positioned at a recess of the panel between adjacent ones of the projections.

The frame structure may have a groove or channel in which at least one photovoltaic element is positioned. An optically transmissive covering may be positioned over the at least one photovoltaic element and in the groove or channel to protect the at least one photovoltaic element. An edge of the panel is positioned within or at the groove or channel. The at least one photovoltaic element may have a width that is larger than a thickness of the panel and may be positioned such that at least a portion of light that is guided towards the edge of the panel, but is scattered out of the panel in the proximity of the edge, is collected by the at least one photovoltaic element. Alternatively, the at least one photovoltaic element may have a width that approximates a thickness of the panel.

In one embodiment the of the present invention the panel has bores at edges, such as in the proximity of corners of the panel, and the panel is secured within the device by brackets that extend from the frame to the bores of the panel and wherein the panel is coupled to the brackets by projections that project through the bores. The projections may be bolts. At least one photovoltaic element may be positioned between the frame and the panel and may have a width that is larger than a thickness of the panel and is positioned such that at least a portion of light that is guided towards the edge of the panel, but is scattered out of the panel in the proximity of the edge, is collected by the at least one photovoltaic element. In this embodiment the at least one photovoltaic element may be positioned in a groove of the frame and an edge of the panel may also be positioned in the groove. Alternatively, the edge of the panel may not be positioned in a groove (and the at least one photovoltaic element may or may not be positioned in a groove) and the panel may be held exclusively by the bracket with the bolt and a suitable sealing agent that may be applied between edges of the panel and the frame.

In some embodiments, the panel is spectrally selective. The component of the panel may be arranged such that at least a portion of incident IR light and/or visible light is redirected in a direction that is transversal to the surface normal of the panel, whereby the device is arranged such that at least a portion of IR light and/or visible light and/or UV light that is incident on the panel is directed towards the at least one photovoltaic element.

The panel may be transmissive for more than 80%, 70%, 50%, 30%, 20% or 10% of incident visible light and at least a portion of the visible light may be directed in the at least one direction that is transversal to a surface normal of the panel.

The frame structure may be arranged to support the at least one photovoltaic element at a position that is at the edge or side portion of the panel and in front and/or behind of the edge or side portion of the panel.

In an embodiment the panel comprises at least one additional photovoltaic element that is positioned in a direction along the receiving surface of the panel wherein the device is arranged such that at least a portion of the redirected incident light is directed towards the at least one additional photovoltaic element.

In one embodiment the panel is arranged such that at least a portion of incident light is directed entirely within solid material of the panel and along the panel towards a side portion or an edge of the panel.

The panel may also comprise at least two spaced apart component panels that are positioned substantially parallel to each other. At least one or an additional photovoltaic element may be supported at a position that is at least partially between adjacent component panels and at or near edge portions of the component panel such that at least a portion of light that is redirected by the panel into a region between the adjacent component panels is directed towards the at least one or the additional photovoltaic element.

The device may further comprise at least one diode that is arranged to control a direction of a flow of a current generated by the at least one photovoltaic element of the device. For example, if the device comprises a plurality of photovoltaic elements that are connected in parallel, the at least one diode may be arranged such that a direction of current flow in a photovoltaic element that does not result in a reduction of an electrical output of the device. By controlling the direction of current flow influences of shading or faulty photovoltaic element on an electrical output of the device may be reduced.

The device, which may be provided in the form of a window of a building or another structure, may comprise at least one further photovoltaic element that is positioned on a side portion of the frame structure to collect incident light that is in use directed towards the frame structure. The at least one further photovoltaic element may be positioned in a plane that is substantially parallel to that of the panel. Alternatively, the at least one further photovoltaic element may be positioned in a plane that is inclined relative to the plane of the panel. For example, the at least one further photovoltaic element may be positioned on the frame structure and in a plane that is inclined in a manner such that a collection of sunlight by the at least one further photovoltaic element in use is facilitated. An angle of inclination may be of any suitable magnitude, such as an angle within the range 70-60, 60-50, 50-40, 40-30, 30-20, 20-10 and 10-1 degrees. The plane in which the at least one further photovoltaic element is positioned may be inclined about any suitable axis, such as an axis that is substantially horizontal when the device is in use. Further, the at least one further photovoltaic element may be inclined by an angle that is larger than 90 degrees relative to a ground plane when the device is in use and positioned in a generally vertical orientation.

In one embodiment the device comprises a first plurality of photovoltaic elements that are positioned at edges of the panel to collect light this is directed towards the edges of the panel and a second plurality of further photovoltaic elements that are positioned on the frame structure to collect light that is in use directed towards the frame structure. At least two of the photovoltaic elements of the first plurality may be connected in parallel to each other and at least two of the second plurality of further photovoltaic elements may also be connected in parallel to each other. The device may further comprise first diodes that are series connected with respective ones of the first photovoltaic elements and second diodes that are series connected with respective ones of the second photovoltaic elements such that a current flow in a component of the device (such as a faulty component or a photovoltaic cell that is overshadowed) in a direction that would have an adverse influence on the output of the device can be reduced. The first plurality of the photovoltaic elements may be connected in parallel to the second plurality of the further photovoltaic elements.

The photovoltaic elements may be of the same type or at least some of the photovoltaic elements may be of different types. For example, the photovoltaic elements may comprise different types of semiconductor material, such as one or more of Si, CdS, CdTe, GaAs, CIS or CIGS.

The at least one electric element may comprise at least one electric lead that is coupled to the at least one photovoltaic element. The at least one electric lead may be positioned within the frame structure, for example within a channel portion, and may be surrounded by the frame structure.

The device may comprise at least one coupling for coupling to external electric devices. The at least one coupling may be positioned at a surface portion of the frame structure such that the at least one coupling is accessible from a location outside the device. The at least one coupling may comprise a socket that is directly or indirectly electrically coupled to the at least one photovoltaic element. For example, the socket may be arranged for coupling directly or indirectly to a smart phone, tablet, computer or any other suitable device to operate the device or charge a battery of the device. The at least one coupling may further comprise a transformer that is arranged to transform an output from the at least one photovoltaic element. In a specific example, the output may be a voltage and the transformer may be arranged to transform that voltage into any suitable voltage, such as substantially 18V, which is particularly suitable for charging a battery of a mobile device.

In addition, the device itself may comprise further electric components. For example, the device may comprise a battery and may be arranged to charge the battery using electric energy generated by the at least one photovoltaic element. The electric component may also comprise a transformer that is arranged to receive an output from the at least one photovoltaic element. A transformed output may be accessible via the socket or the like. Further, the device may comprise a voltage regulator and may also comprise an inverter.

The at least one electric element may also comprise a light source, such as a LED light source, that is used to supplement illumination using electrical energy provided (directly or indirectly) by the at least one photovoltaic element. Additionally, the at least one electric element may also comprise a battery together with additional suitable electric components and the device may be arranged for night time illumination (for example) using the light source and electric energy provided by the battery that is charged during daytime.

The frame structure may comprise any suitable material (such as a metallic or plastics material) and may define interior portions in which the electric components and electric leads may be positioned.

The frame structure may comprise portions that are positioned along edges of the panel and may surround the panel.

In one embodiment, the device comprises a further panel such as a glass panel and the panels are positioned in parallel to each other. The device may for example be provided in form of a double-glassed window of a building.

The device may further comprise a cooling arrangement that is arranged for cooling the photovoltaic elements. The cooling arrangement may comprise a heat sink that may be positioned on a portion of the frame structure. The cooling arrangement may also be arranged to transfer heat from the photovoltaic elements to a further medium. For example, the further medium may be water.

The device may be provided in the form of a window of a building, motor vehicle or any other structure that comprises windows.

The following will describe further details of the spectrally selective panel of the device in accordance with either one of the first and second aspects of the present invention.

The spectrally selective panel has in one embodiment a receiving surface for receiving incident radiation and comprises at least one reflective component that is arranged to reflect at least a portion of received incident radiation that penetrated through a depth portion of the panel to the reflective component, the at least one reflective component comprising a series of reflective portions that are inclined relative to the receiving surface such that at least a portion of the reflected radiation is re-directed within and along the panel.

The at least one reflective component may comprise an optical interference coating that is positioned at or in the proximity of the reflective portions and arranged to reflect at least a portion of incident radiation. The reflective portions may for example be arranged in a "saw-tooth" arrangement. Each reflective portion typically is provided in the form of a strip of any suitable length, such as a length that extends along at least a portion of, or the entire, length or width of the spectrally selective panel.

In an alternative embodiment the spectrally selective panel may comprise:
  a first material being at least partially transmissive for light having a wavelength in the visible wavelength range and being arranged for guiding suitable light; and
  a diffractive element being positioned within the first material, the diffractive element being arranged to deflect predominantly light having a wavelength in an IR wavelength band and having a plurality of grooves that are at least partially filled with a scattering material or a luminescent material;
  wherein the diffractive element is arranged such that at least a portion of energy associated with IR light incident from at least one transversal direction of the spectrally selective panel is directed towards a side portion or edge of the panel.

In an embodiment the spectrally selective panel may also comprise an optical interference coating that is arranged to reflect incident light within an infrared (IR) wavelength band and/or within an ultraviolet (UV) wavelength band while being largely transmissive for at least the majority of light having a wavelength within the visible wavelength band, the optical interference coating comprising layers of dielectric materials.

The optical interference coating may be positioned such that in use incident light penetrates through the first panel portion before reaching the optical interference coating.

In addition, the spectrally selective panel may also comprise a luminescent material that is arranged to absorb at least a portion of incident and/or reflected radiation and emit radiation by luminescence.

In accordance with a third aspect of the invention, there is provided a device for generating electric energy, the device comprising:
  a panel that is at least partially transmissive for visible light, the panel having a component that is arranged such that at least a portion of incident light received at a receiving surface of the panel is redirected along the panel to a side portion or edge of the panel;
  at least one photovoltaic element, the at least one photovoltaic element and the panel being arranged in a mutually overlapping relationship to each other;
  wherein the device is arranged such that at least a portion of the redirected incident light is directed towards the at least one photovoltaic element to generate electric energy.

The at least one photovoltaic element may be positioned at an edge portion of the surface of the panel.

The at least one photovoltaic element may be arranged in a direction along the receiving surface of the panel. Alternatively, the at least one photovoltaic element may be inclined relative to the portion of the panel.

In a specific embodiment, the at least one photovoltaic element is arranged on a portion of the receiving surface of the panel and/or on a portion of a surface that is opposite to the receiving surface. For example, a pair of photovoltaic elements may be positioned on respective opposite surfaces and arranged to face each other.

The at least one photovoltaic element typically has at least one active surface portion that faces the panel. In a specific embodiment, the at least one photovoltaic element has at least two active surface portions wherein at least one active surface portion faces towards the incident light. In this way, in addition to the redirected incident light, the at least one photovoltaic elements can directly receive a portion of the incident light.

In an embodiment, the device further comprises at least one further photovoltaic element positioned at the side portion or the edge of the panel and is substantially perpendicular relative to the at least one photovoltaic element.

In some embodiments, the panel is spectrally selective and the component is arranged such that at least a portion of incident infrared (IR) light and/or ultraviolet (UV) light is directed towards the at least one photovoltaic element.

The panel may be transmissive for more than 80%, 70%, 50%, 30%, 20% or 10% of incident visible light and at least a portion of the incident visible light is directed in a direction that is substantially transversal to a surface normal of the panel.

In accordance with a fourth aspect of the present invention there is provided a system comprising a plurality of devices in accordance with any one of the first, second or third aspect of the present invention.

The plurality of devices may be electrically connected in parallel. The system may comprise at least one electrical coupling that interconnects a plurality of the devices in a modular manner. Further, the system may comprise a plurality of diodes that are arranged to control a direction of a flow of a current generated by the at least one photovoltaic element of each device such that an adverse influence of a direction of current flow in a portion of the device on an output of the device is reduced.

In accordance with a fifth aspect of the present invention there is provided a method of manufacturing the device in accordance with any one of the first, second or third aspects of the present invention, the method comprising the steps of:
  providing the panel;
  providing the frame structure;
  providing the photovoltaic elements;
  positioning the photovoltaic elements in or on the frame structure; and thereafter
  positioning the panel into or on the frame structure.

The method may comprise forming a groove or channel and positioning at least one of the photovoltaic elements in the groove or channel. Further, the method may comprise positioning a cover of an optically transmissive material over the at least one photovoltaic element and into the groove or channel to protect the photovoltaic element.

The method may be conducted such that at least one of the photovoltaic elements is positioned between the frame and the panel.

DETAILED DESCRIPTION OF SPECIFIC EMBODIMENTS

Figure 1:
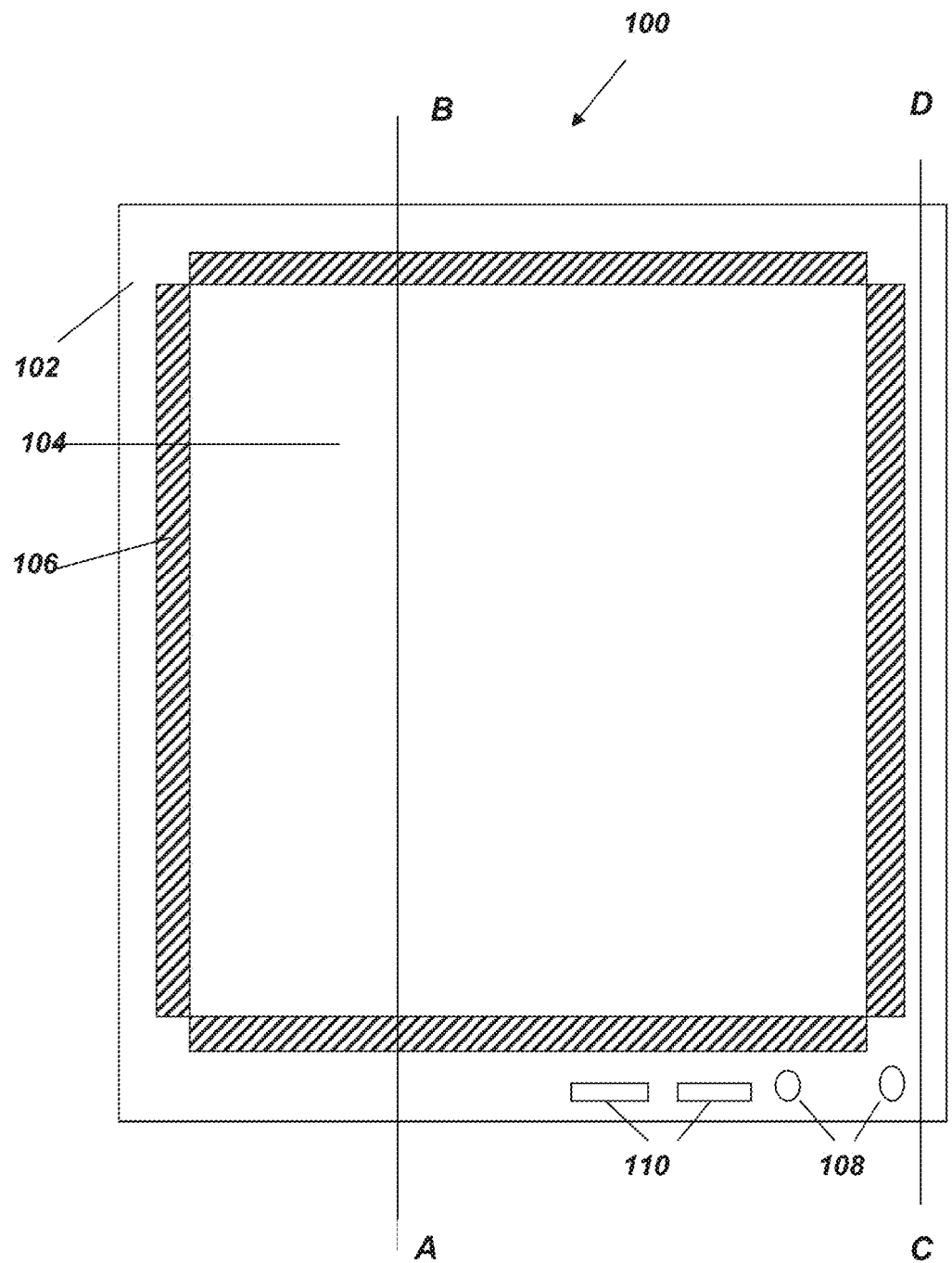
FIG. 1 is a cross-sectional representation of a device in accordance with an embodiment of the present invention.

Referring initially to FIGS. 1 to 9, a device comprising a spectrally selective panel according to an embodiment of the present invention is now described.

The device 100 may for example be provided in the form of a window of a building, a sky light, a window of a car or any other structure that usually comprises windows. A person skilled in the art will appreciate that the device 100 may be applied to different structures, such as walls and roof and the like.

In this particular embodiment, the device comprises a frame 102 that holds a spectrally selective panel 104. The spectrally selective panel 104 comprises various components that will be described further below in more detail. The spectrally selective panel 104 is arranged such that a portion of incident infrared (IR) light, such as sunlight, is directed towards side portions or edges of the panel 104. The IR light may be directed within and along the panel 104 towards an edge of the panel 104. Further, a portion of the IR light may also be directed towards a region that is in front or behind the panel 104 at side portions of the panel 104. The spectrally selective panel 104 is arranged such that at least the majority of light within the visible wavelength range is transmitted.

In an alternative embodiment the panel is arranged such that at least a portion of visible light is directed towards the side portions or edges of the panel and consequently towards the at least one photovoltaic element. Specifically, the visible light transmission of the panel may be less than 80%, or less than 70%, or less than 50%, or less than 30%, or less than 20% or even less than 10%.

The frame structure 102 may be provided in a suitable form and may be formed from any suitable materials, such as metallic materials, plastic materials or wood. The frame 102 surrounds the panel 104 and also supports photovoltaic elements 106. The frame 102 comprises holders in form of brackets or the like to hold the photovoltaic elements 106 in positions at which in use the photovoltaic elements 106 receive at least a portion of the re-directed IR light. In this embodiment, the photovoltaic elements 106 are replaceable.

Specifically, the holders for the photovoltaic elements 106 are arranged such that the photovoltaic elements 106 can be replaced, if for example a photovoltaic element is faulty or is replaced with a different type of photovoltaic element.

In this particular embodiment, the photovoltaic elements 106 are of the same type. However, it should be appreciated that the photovoltaic elements may include elements that are of different types. For example, the photovoltaic elements may comprise different respective semiconductor materials, such as Si, CdS, CdTe, GaAs, CIS or CIGS or any other suitable semiconductor material.

The frame structure 102 comprises in this embodiment sockets 108 that are electrically connected to the photovoltaic elements 106. The sockets 108 may be arranged for connection to a smart phone, a computer or any other device for operation of the device or charging of a battery of the device. Specifically, the sockets 108 that are electrically connected to the photovoltaic elements 106 may be arranged to provide a voltage of substantially 18V, which is particularly suitable for charging a battery of a mobile device. In one example, the sockets 108 further comprise a transformer for transforming a voltage output from the photovoltaic elements 106 to a suitable voltage, such as the abovementioned 18V. In a variation of the described embodiment the frame may also comprise a plug for any suitable application.

The frame 102 further comprises electric devices 110 and may for example comprise a transformer that is arranged to transform a voltage output from the photovoltaic elements 106. Further, the electric devices 110 may comprise a voltage regulator and an inverter to generate an AC current. The electric devices 110 may also comprise a battery that is arranged to receive charges directly from the photovoltaic elements 106. The battery may be coupled to the sockets 108. Consequently, the device 100 may be arranged to direct IR light towards edges or side portions of the panel 104, convert the re-directed IR light into electrical energy and charge a battery or operate an external device.

In addition, the electric devices 110 may comprise a light source, such as an LED light source that is operated using electrical energy provided by the photovoltaic elements 106 such that an amount of visible light can be increased. Alternatively or additionally, the electric devices 110 may comprise a battery, a light source and suitable electronic components. The device 100 may in this case be arranged for night time illumination using the light source (such as LED lamps) that are positioned in the frame 102 and are operated using electric energy provided by the battery. The frame 102 comprises cavities (not shown) for directing electric leads between the abovementioned components.

Figure 2:
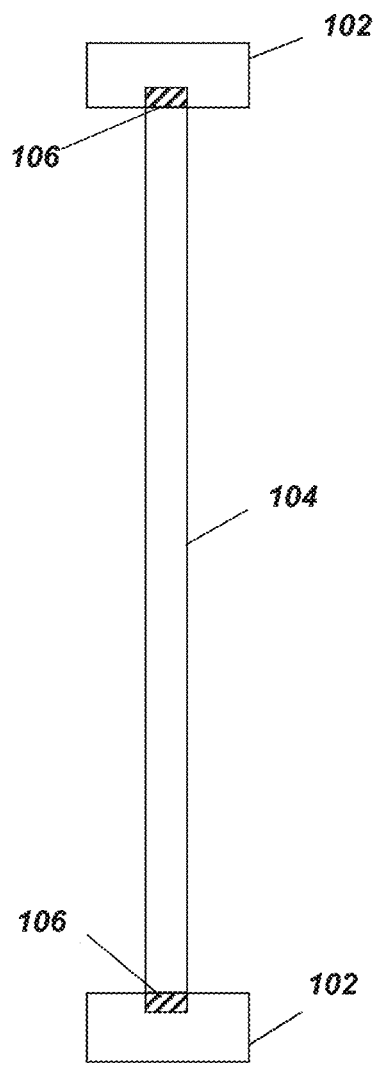
FIG. 2 is a cross-sectional representation (along line AB as shown in FIG. 1) of a device in accordance with an embodiment of the present invention.

FIG. 2 shows a cross-sectional view (along line A-B in FIG. 1) of a device in accordance with a first specific embodiment of the present invention. In this embodiment the panel 104 is arranged to direct incident IR light within and along the panel towards an edge of the panel such that the re-directed IR light exits the panel 104 via an edge of he panel 104 and is received by the photovoltaic element 106 at the edge.

Figure 3:
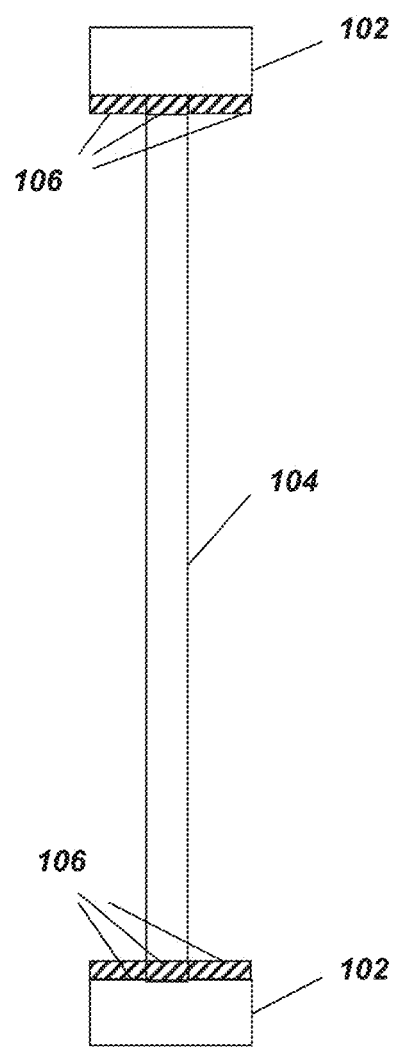
FIG. 3 is a cross-sectional representation (along line AB as shown in FIG. 1) of a device in accordance with another embodiment of the present invention.

FIG. 3 shows a cross-sectional representation of the device in accordance with a further specific embodiment of the present invention. It should be noted that throughout the specification like numerals are used for like components. The device comprises in this case additional photovoltaic elements 106 that are arranged to collect IR light that is redirected to regions that are in front and behind the panel 104. It will be appreciated that adjacent photovoltaic elements 106 may alternatively also be replaced by a single photovoltaic element 106.

Figure 4:
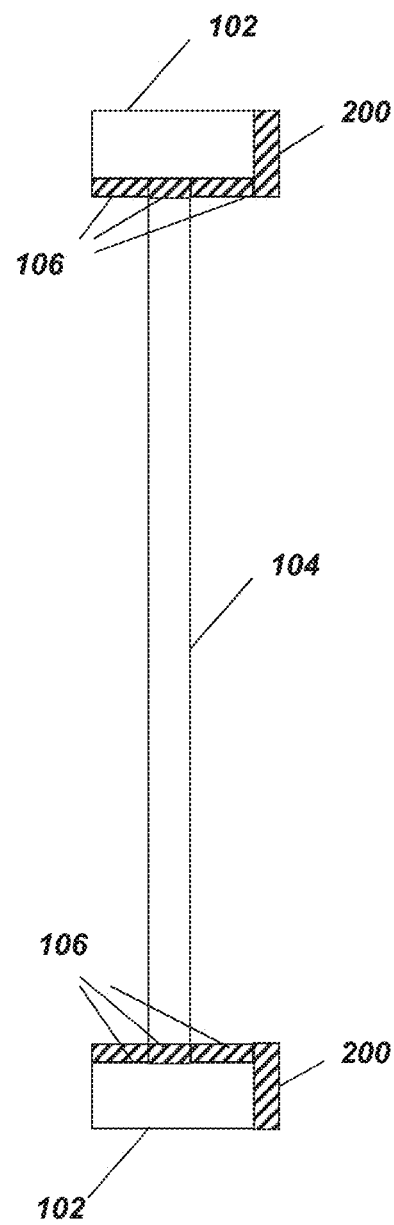
FIGS. 4, 5 and 6 are cross-sectional representations of variations of the device shown in FIG. 3 in accordance with embodiments of the present invention.

FIG. 4 illustrates a cross-sectional representation that is related to that shown in FIG. 3, but the device comprises further photovoltaic elements 200 that are positioned on a face of the frame structure 102. The further photovoltaic elements 200 form a right angle with the photovoltaic elements 106. In this embodiment, the device 100 is provided in the form of a window for a building and the further photovoltaic elements 200 are in use positioned outside the frame structure 102 to receive incident light that is directed towards the frame structure 102. The further photovoltaic elements 200 are positioned below a covering panel (such as a glass panel or a panel formed from a suitable plastics material). In this embodiment, the panel 104 and the frame structure 102 are substantially rectangular and the frame comprises four further photovoltaic elements 200, one for each side portion. Alternatively, each further photovoltaic element 200 may comprise a plurality of photovoltaic elements.

Figure 5:
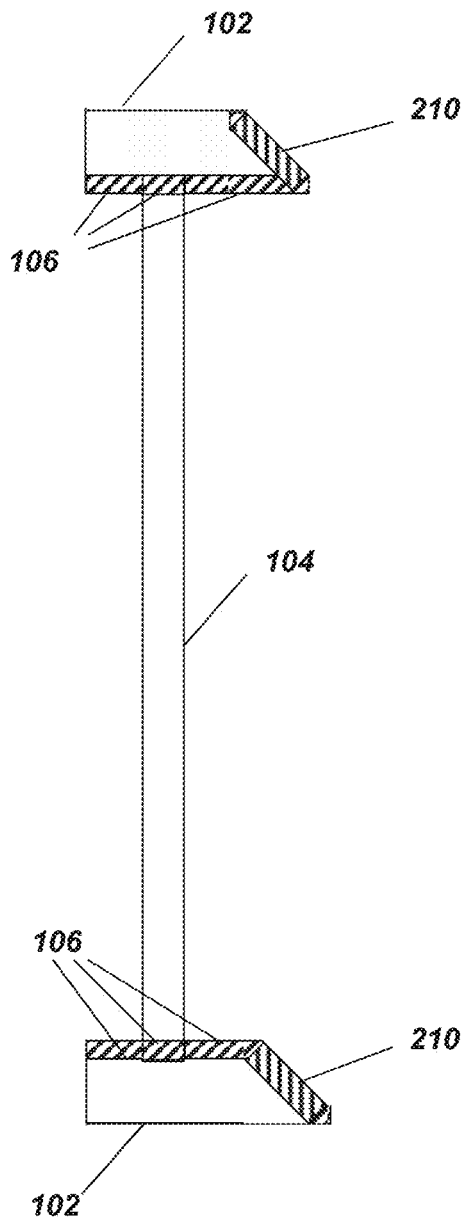

Turning now to FIG. 5, there is illustrated a cross-sectional representation of a further specific embodiment of the device 100. The shown cross-sectional representation is related to that shown in FIG. 4, but in this case further photovoltaic elements 210 do not form a right angle with the photovoltaic elements 106, but are positioned on an inclined surface. The surfaces are inclined (for example by an angle of 30 degrees relative to the panel 104 or another suitable angle) such that reception of incident light by the photovoltaic elements 210 is facilitated if the device is positioned in a substantially vertical orientation, such as when embodied in the form of a window of a building.

Figure 6:
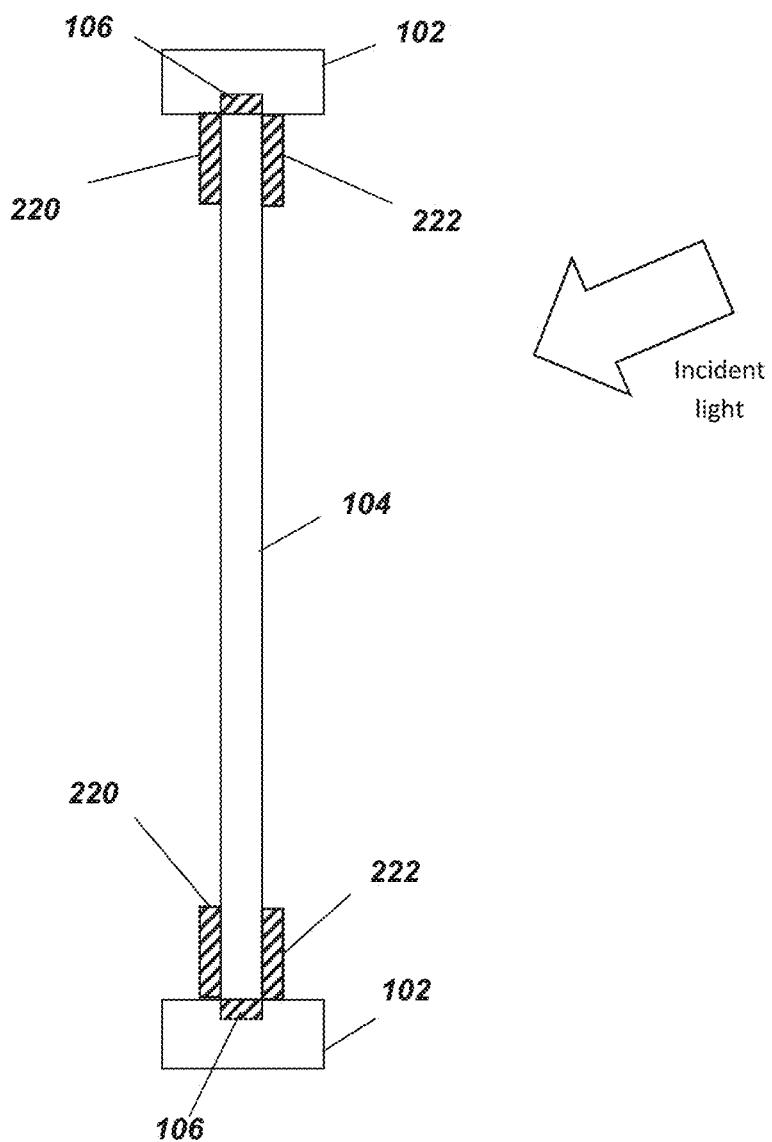

FIG. 6 shows a cross sectional representation of the device 100 in accordance with a further specific embodiment. In this embodiment, the device 100 comprises the photovoltaic elements 106 that are positioned at the edge of the panel as exemplarily shown in FIG. 2.

In addition, the device 100 comprises further photovoltaic elements 220, 222. The further photovoltaic elements 220, 222 and the panel 104 are in a mutually overlapping relationship with each other. Specifically, the further photovoltaic elements 220, 220 extend in a direction along the receiving surface of the panel 104. In this example, the further photovoltaic elements 220, 222 are arranged opposite to each other. In particular, the further photovoltaic elements 222 extend on an edge portion of the receiving surface for incident light, and the further photovoltaic elements 220 extend on an edge portion of a surface that is opposite to the receiving surface. Specifically, the further photovoltaic elements 220, 220 are in contact with the respective surface of the panel 104.

Further, each photovoltaic element 220; 222 has an active surface portion that is arranged to face towards the panel 104 such that light that is redirected along the panel 104 can be received not only by the photovoltaic elements 106 but also by the further photovoltaic elements 220, 222.

In some embodiments, the manufacture of the multilayered spectrally selective panel 104 comprises a sputtering process. In this process, the panel 104 of the device 100 is typically fixated at an edge portion of the panel 104. As a consequence, edge portions of the panel 104 consist of plain glass that omits the spectrally selective characteristics of the remaining panel 104. When incident light is redirected within and along the panel 104, a portion of the redirected light may exit the panel 104 through the edge portions. By covering the edge portions with the further photovoltaic elements 220, 222, the rate of the collected redirected incident light can be increased.

It will be clear to a person skilled in the art that an area for receiving redirected incident light of the further photovoltaic elements 220 may or may not be equal to an area of the photovoltaic elements 106.

In this example, the further photovoltaic elements 222 that are positioned on the edge portions of the receiving surface are arranged to additionally directly collect incident light. In particular, the further photovoltaic elements 222 comprises at least first and second active surface portions wherein the first active surface portion is arranged to face towards the panel and the second active surface portion is arranged to face the incident light. In this example, the active surface portions of the further photovoltaic elements are arranged to face in opposite directions.

A person skilled in the art will appreciate that in an alternative embodiment, the photovoltaic elements 106 may not be required. For example, the photovoltaic elements 106 may be replaced by a reflective component such as an aluminium spacer.

Further, a person skilled in the art will appreciate that in an alternative embodiment, the frame portion 102 may not be required.

Figure 7:
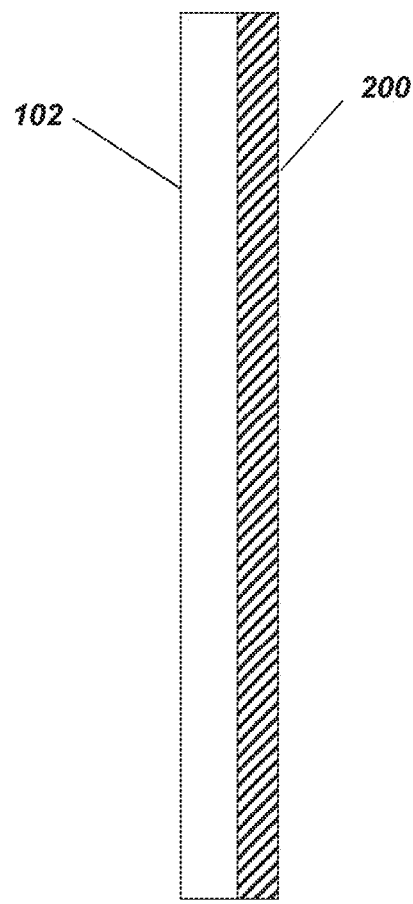
FIGS. 7 and 8 are cross-sectional representations (along line CD as shown in FIG. 1) of a device in accordance with another embodiment of the present invention.

FIG. 7 shows a cross-sectional representation through a side portion of the frame structure 102 of the device 100 taken along line C to D of FIG. 1 in accordance with a specific embodiment of the invention. In this embodiment the frame structure 102 comprises the further photovoltaic cell 200 as illustrated in FIG. 4.

Figure 8:
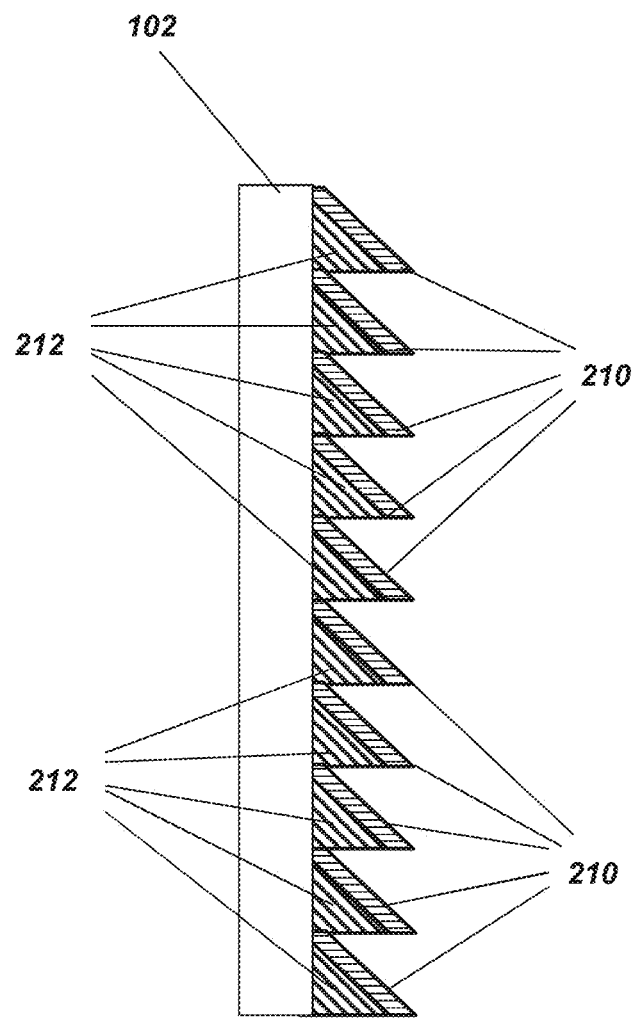

FIG. 8 shows a cross-sectional representation of a device that relates to the embodiment as illustrated in FIG. 5. The cross-section also relates to that taken along the line C to D of FIG. 1. In this embodiment each side portion of the frame structure 102 of the device 100 comprises a plurality of further photovoltaic elements 210 that are each positioned on inclined planes in order to facilitate collection of incident sunlight.

Figure 9:
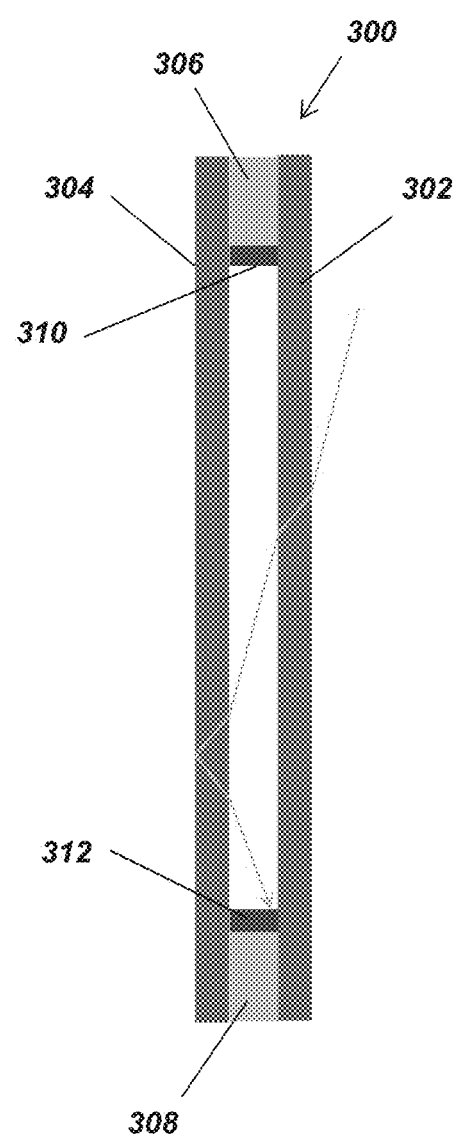
FIG. 9 is a cross-sectional representation of devices in accordance with further embodiments of the present invention.

FIG. 9 illustrates a panel 300 in accordance with another embodiment of the present invention. The panel 300 comprises in this embodiment a first component panel 302 and a second component panel 304. The first and second component panels 302, 304 are parallel to each other and are separated by spacers 306, 308 that define a gap between the component panels 302, 304. The panel 300 may be provided in the form of an insulated glass unit (ICUs). Photovoltaic elements 310, 312 are positioned on interior surfaces of the spacers 306, 308. In this embodiment the photovoltaic elements 310, 312 are positioned such that a portion of incident light that is redirected within the component panels 302, 304, but escapes the component panels 302, 304 before it reached the edges of the component panels 302, 304 is collected by the photovoltaic elements 310 or 312.

The panel 300 may comprise further photovoltaic elements positioned at edges of the panel 300. For example, additional photovoltaic elements may be positioned to collect light that is directed through the edges of the component panel 302, 304 (similar to the embodiment illustrated with reference to the FIG. 2). Further, the panel 300 may also comprise further photovoltaic elements positioned on either side of an edge of the panel 300 (similar to the outer photovoltaic elements 106 illustrated with reference to FIG. 3). Further, the panel 300 may comprise photovoltaic elements positioned along a portion of a surface of at least one of the first and second component panels 302, 304 as exemplarily illustrated in FIG. 6.

Referring back to FIG. 9, internal surfaces of the component panels 302, 304 may or may not be coated with suitable optical coatings that may allow control of a transparency of the panel portions 302, 304 such as electrochromic coatings. In one embodiment the panel 300 is provided in the form of an IGU that has electrically controlled transparency and the energy required for the electrical control is generated by the photovoltaic elements of the panel.

Figure 10:
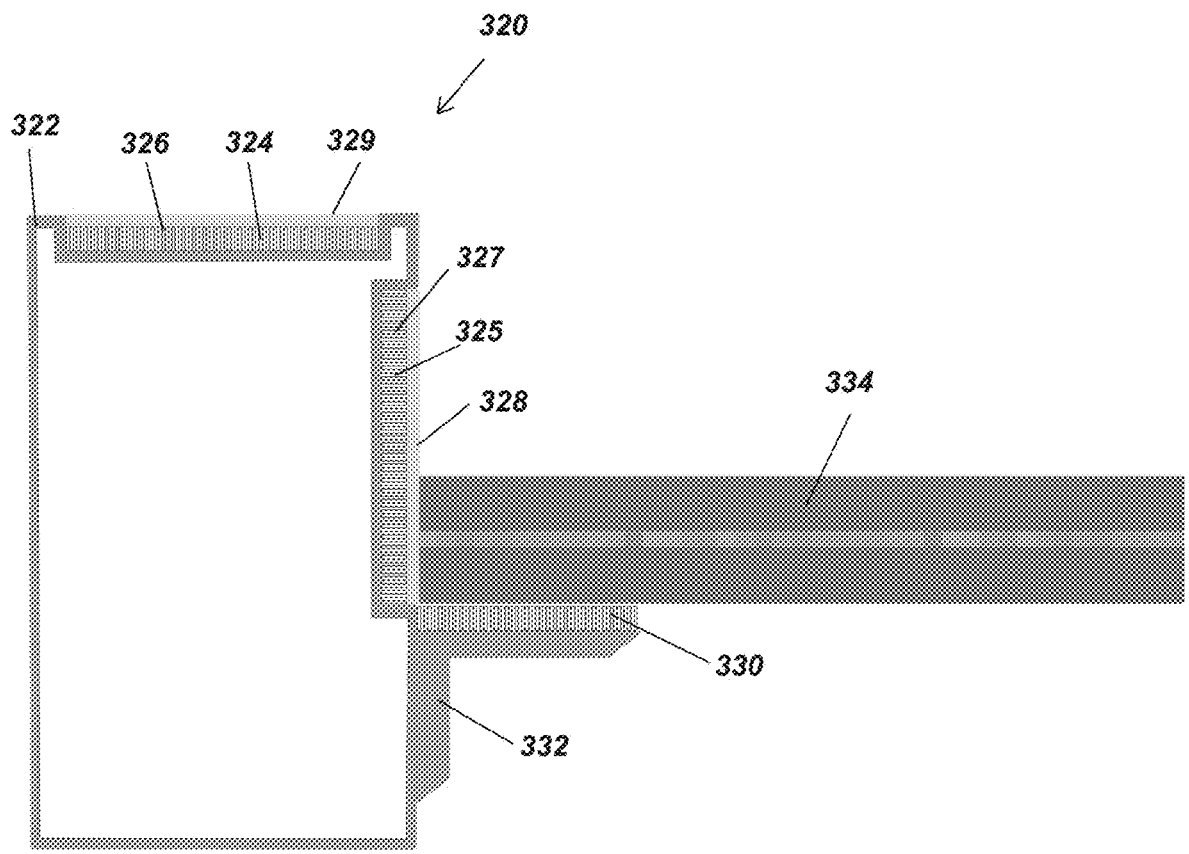
FIG. 10 is a cross-sectional view of a component of the of an embodiment in accordance with the present invention.

FIG. 10 is a cross-sectional view of a portion of a device 320 in accordance with the present invention. The device 320 is of the type of the above-illustrated device 100 and has in this embodiment a frame portion 322 that has grooves 324 and 325 in which photovoltaic elements 326 and 327 are positioned. Protective glass covers 328 and 329 are positioned over the photovoltaic elements 326 and within the grooves. Further photovoltaic elements 330 are positioned on brackets 332 that are attached to the frame portion 322. A panel 334 of the above-described type has an edge that is positioned at the photovoltaic cells 327 and 328. The panel 334 protects the photovoltaic element 330 from impact. The panel 334 directs incident light to edges of the panel 334 and at least a portion of that light is collected by the photovoltaic elements 327 and 330.

Figure 11:
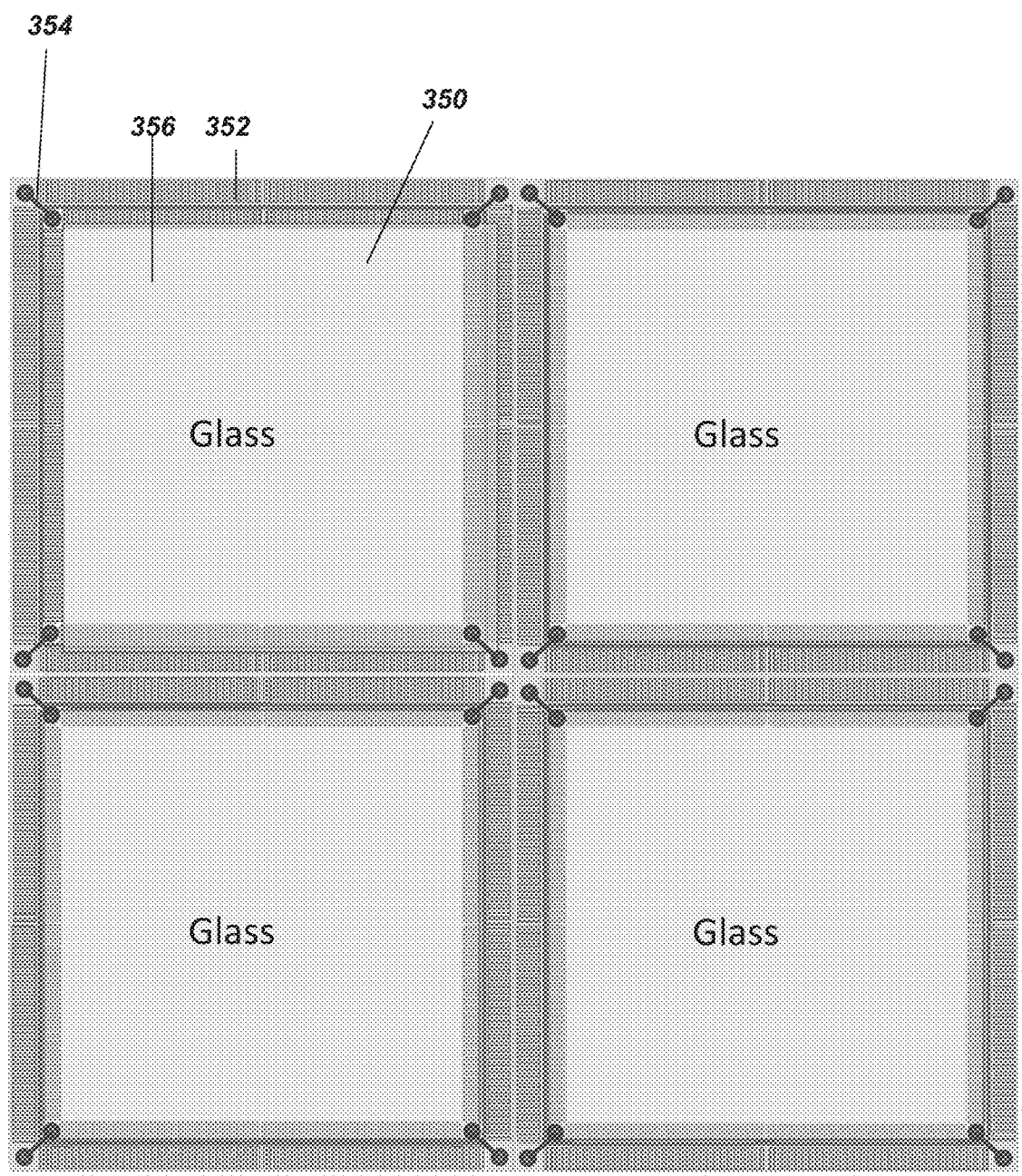
FIG. 11 is a front view of coupled devices in accordance with an embodiment of the present invention.

FIG. 11 shows a front view of four coupled devices 350. Each device 350 is of the type of the device 100 described above. The devices 350 are interconnected in a modular manner and held in frames 352 by brackets 354. Each bracket 354 is coupled at a corner of a panel 356 using a bolt that penetrates through a hole provided within the panel. Photovoltaic elements 358 are positioned on the frame 352. The photovoltaic elements may or may not be positioned in grooves. In one variation the panels 356 are not positioned in grooves, but are placed against photovoltaic elements (with suitable covers) that are positioned between the frames 352 and the panels 356 and the panels are secures in position only by the brackets 354 with bolts and a suitable adhering and sealing agent that is applied along the edges of the panels 356.

Figure 12:
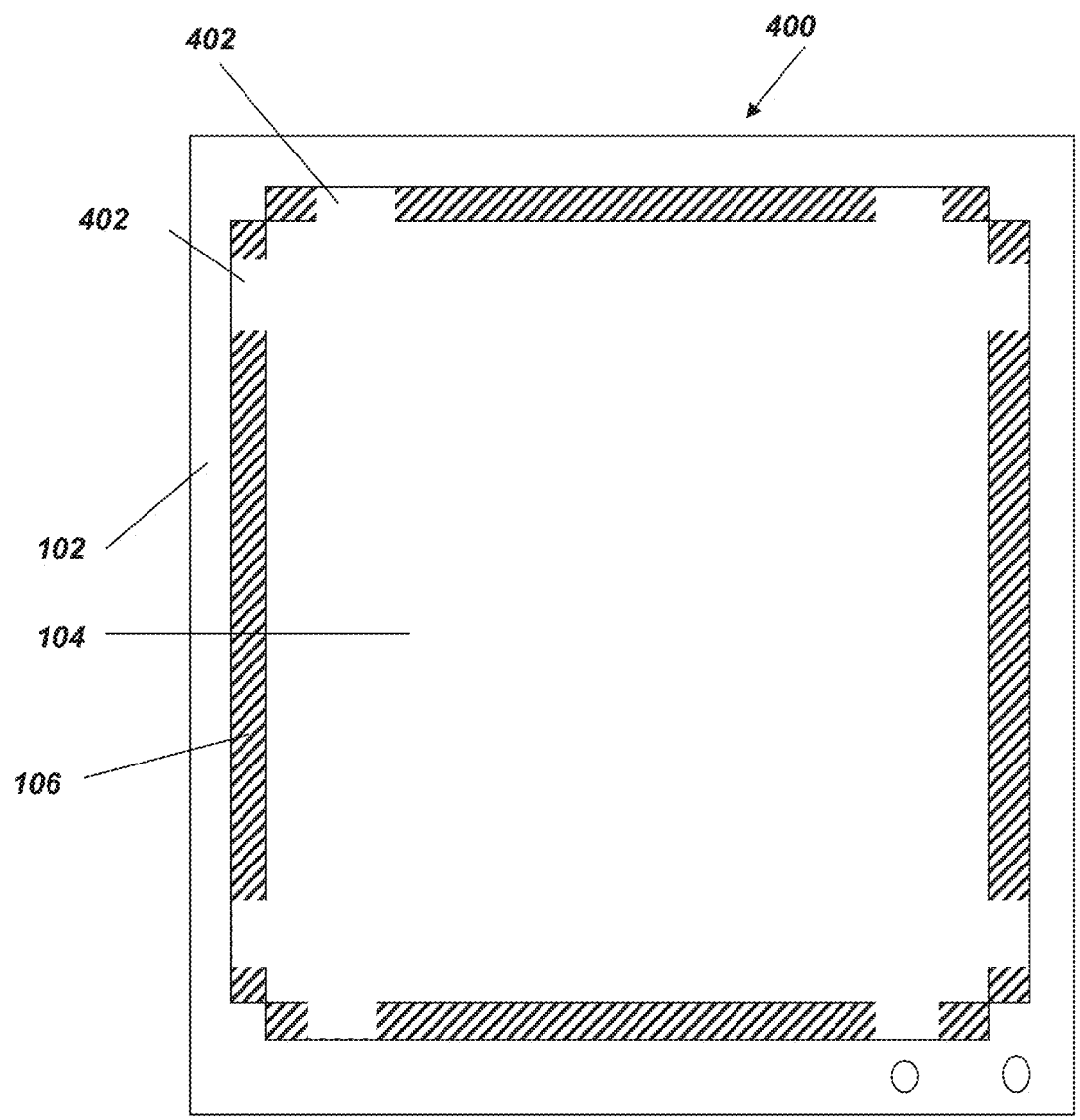
FIG. 12 is a cross-sectional representation of devices in accordance with further embodiments of the present invention.

FIG. 12 shows a device 400 comprising a spectrally selective panel in accordance with a further embodiment. The device 400 also comprises a frame structure 102, a spectrally selective panel 104 and photovoltaic elements 106. In comparison with device 100 shown in FIG. 1, the spectrally selective panel 104 of the device 400 further comprises eight projections 402 that project from edges or side portions of the panel 104. The projections project within a plane of the spectrally selective panel and at which the frame 102 supports the spectrally selective panel 104. In this particular embodiment, two projections are located at each of the four edges of the panel 104. Further, the projections 402 are integrally formed with the panel 104. The projections 402 are located such that they can be supported by the frame structure 102. For example, the frame structure 102 may comprise a channel portion that is arranged to receive the projections 402. A person skilled in the art will appreciate that other arrangements of projections is envisaged. For example, the panel may have four projections, two projections being located on opposite edges of the edges of the panel 104.

In this particular embodiment, the photovoltaic elements 106 are located at recesses of the spectrally selective panel 104 that are defined by the projections 402.

Further, the spectrally selective panel 104 of the device 400 is supported by the frame such that the panel 104 is replaceable. In this example, the device 400 is arranged such that the spectrally selective panel 104 can be replaced without replacing the photovoltaic elements 106.

Figure 13:
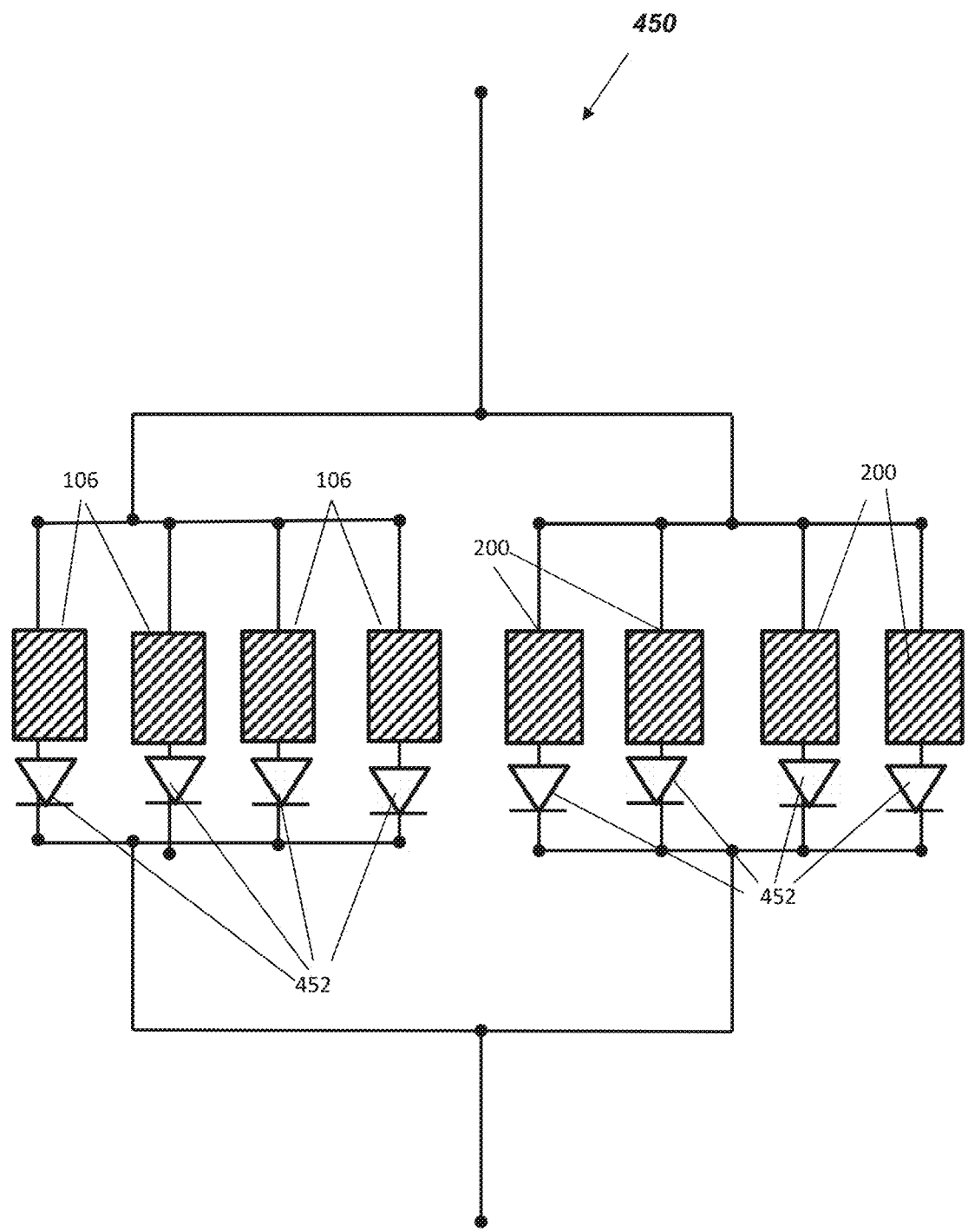
FIG. 13 is a schematic wiring diagram of a device in accordance with an embodiment of the present invention.

FIG. 13 illustrates a wiring diagram that relates to the embodiment illustrated with reference to FIGS. 4 and 7. In this case, the device 100 comprises photovoltaic elements 106 that are connected in parallel to each other. Further, the photovoltaic elements 200 are also connected in parallel to each other. The wiring diagram 450 further shows diodes 452 that control a direction of current flow and thereby reduce an adverse influence (current back-flow) on the overall output of the device 100. In this embodiment each photovoltaic element 106 and each photovoltaic element 200 is in series connected with a respective diode 452. It will be appreciated that in a variation of the described embodiment each diode 452 may also be in series connected with a group of photovoltaic cells. In general, photovoltaic elements of comparable positioning are grouped together and connected in parallel with another such group of photovoltaic elements in order to reduce an influence of a local defect or an effect of a shadow on a specific portion of the device on the overall current output.

A person skilled in the art will appreciate that a similar wiring diagram as shown in FIG. 13 can be applied to the specific embodiment shown in FIG. 6 in which the further photovoltaic cells 220 are positioned along a portion of the surface of the panel.

Figure 14:
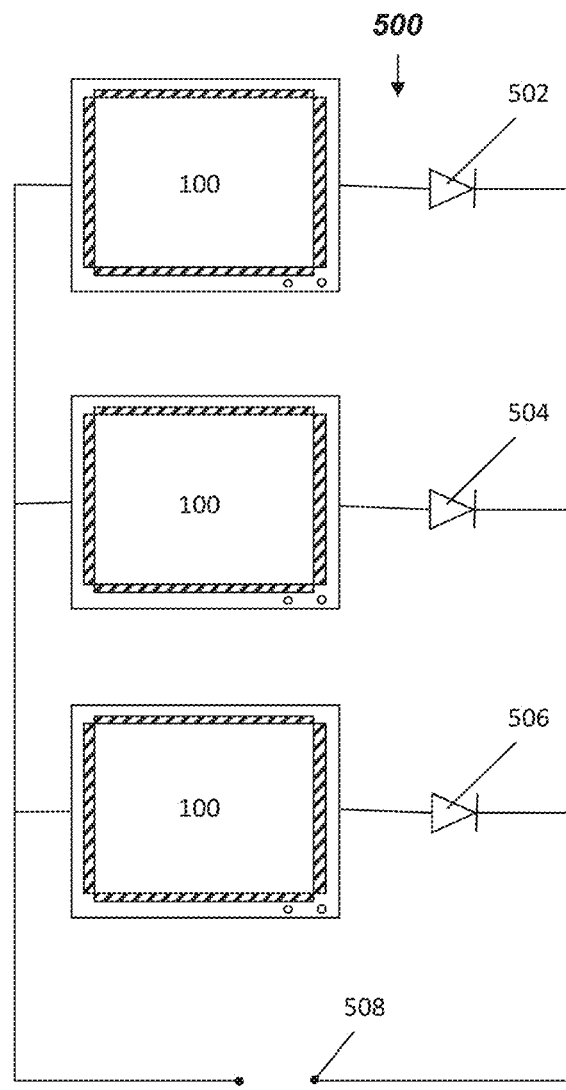
FIG. 14 is a schematic wiring diagram of a plurality of the devices in accordance with embodiments of the present invention.

Referring now to FIG. 14, there is shown a system 500 for providing electric energy comprising a plurality of devices 100 as shown in FIG. 1. However, a person skilled in the art will appreciate that the system 500 may comprise a plurality of devices that are similar to the device 100 but do not necessarily have a frame structure.

In this particular embodiment shown in FIG. 14, the system 500 comprises three devices 100 that are electrically connected in parallel. However, a person skilled in the art will appreciate that the plurality of devices may be electrically connected in series. A combination of both is also envisaged, for example, a series of three devices may be connected in parallel with another series of three devices.

The system 500 further comprises three diodes 502, 504 and 506 that are configured to control a direction of a flow of a current generated by each of the devices 100.

Similarly, the photovoltaic elements 106 of each device may be electrically connected in parallel and diodes may be connected in a manner such that the current flow in each device can be controlled.

Referring back to the system 500 as shown in FIG. 14, the system 500 further comprises a cooling arrangement (not shown) for cooling the photovoltaic elements of the three of devices 100. The photovoltaic elements 106 have a tendency to heat up during use. By cooling the photovoltaic elements 106, efficiency of the elements 106 can be improved. The cooling arrangement can comprise a heat sink or vents that may be positioned on or at a portion of the frame 102. The cooling arrangement may additionally be arranged to transfer heat to water.

It should be appreciated that such cooling arrangement may also be connected to a single device such as device 100 or device 400.

Figure 15:
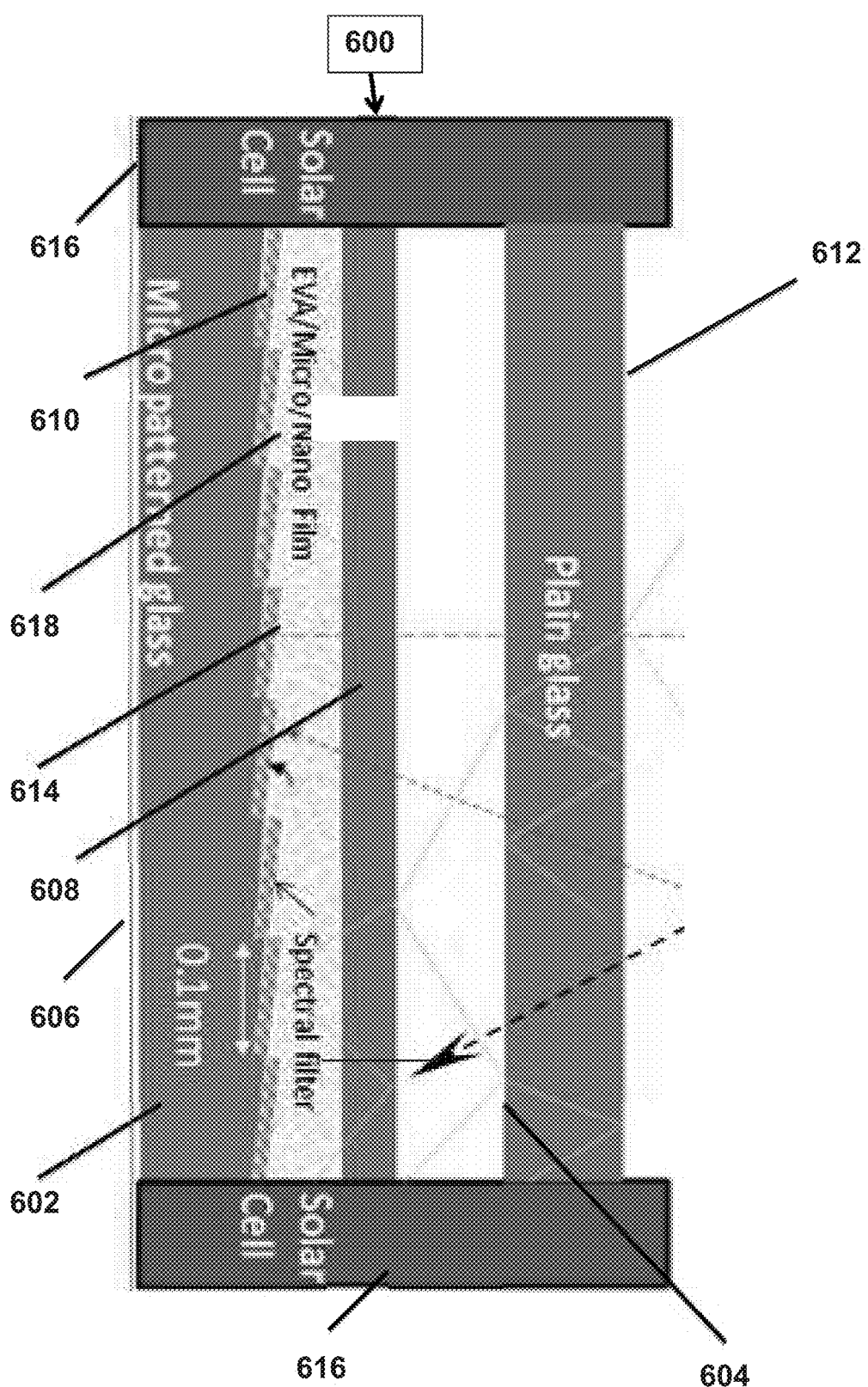
FIGS. 15 and 16 are schematic representations of spectrally selective panels in accordance with embodiments of the present invention.

Referring now to FIG. 15, a spectrally selective panel 600 according to an embodiment of the present invention is now described. The spectrally selective panel 600 may for example replace the spectrally selective panel 104 and photovoltaic elements 106 described above with reference to FIG. 1. The spectrally selective panel 600 reduces transmission of radiation having a wavelength in an IR wavelength band while being largely transmissive for visible light. In a variation of this embodiment the panel 600 may reduce transmission of IR and visible light and direct IR and visible light to edges of the selective panel 600.

The spectrally selective panel 600 comprises a first panel 602 and a second panel 604. The first and second panels 602 and 604 are spaced apart such that an air gap is formed. In an alternative embodiment the gap may be filled with any other suitable dielectric material. The first panel 602 comprises panel portions 606 and 608 and the panel portion 606 has a profiled surface on which a multilayered optical interference coating 610 is positioned. The profiled surface together with the optical interference coating 610 forms a reflective component.

In another variation (not shown) the first panel 602 comprises two panel portions that both have profiled mating surfaces at which the multilayer coating is positioned and at which the panel portions are joined using a suitable optical adhesive.

The spectrally selective panel 600 has a receiving surface 612 via which radiation, such as sunlight, is received. The reflective component is arranged to reflect a portion of incident radiation that penetrated through the second panel 604 and through a depth portion of the first panel 602 to the reflective component. The reflective component comprises a series of reflective portions 614 that are inclined relative to the receiving surface 612 of the second panel 604. The reflective portions 614 are oriented and the layer 610 is arranged such that a portion of the received incident radiation is re-directed within and along the spectrally selective panel 600.

The reflective portions 614 are inclined such that, when the panel 600 is positioned in a suitable vertical position, spectrally selected sunlight (dependent on properties of the layer 610) that is incident at an angle of 40 to 50 degrees above horizon is redirected and guided (facilitated by total internal reflection at interfaces) towards edges of the spectrally selective panel 600.

The spectrally selective panel 600 directs light to photovoltaic elements 616 which are held by a frame (not shown) that is similar to the frame 102 described above with reference to FIGS. 1 to 10.

The panel portions 606, 608 and the second panel 604 may be formed from any suitable material, such as glass or a polymeric material.

In this embodiment each reflective portion 614 is provided in the form of a strip that may have any suitable length and a width of the order of 0.01-1 mm, 0.05-0.5, 0.7-0.3 mm, such as of the order of 0.1 mm. In an alternative embodiment each reflective portion 614 may also have a larger width, such as a width larger than 1 mm, 5 mm, 10 mm or 20 mm.

Figure 16:
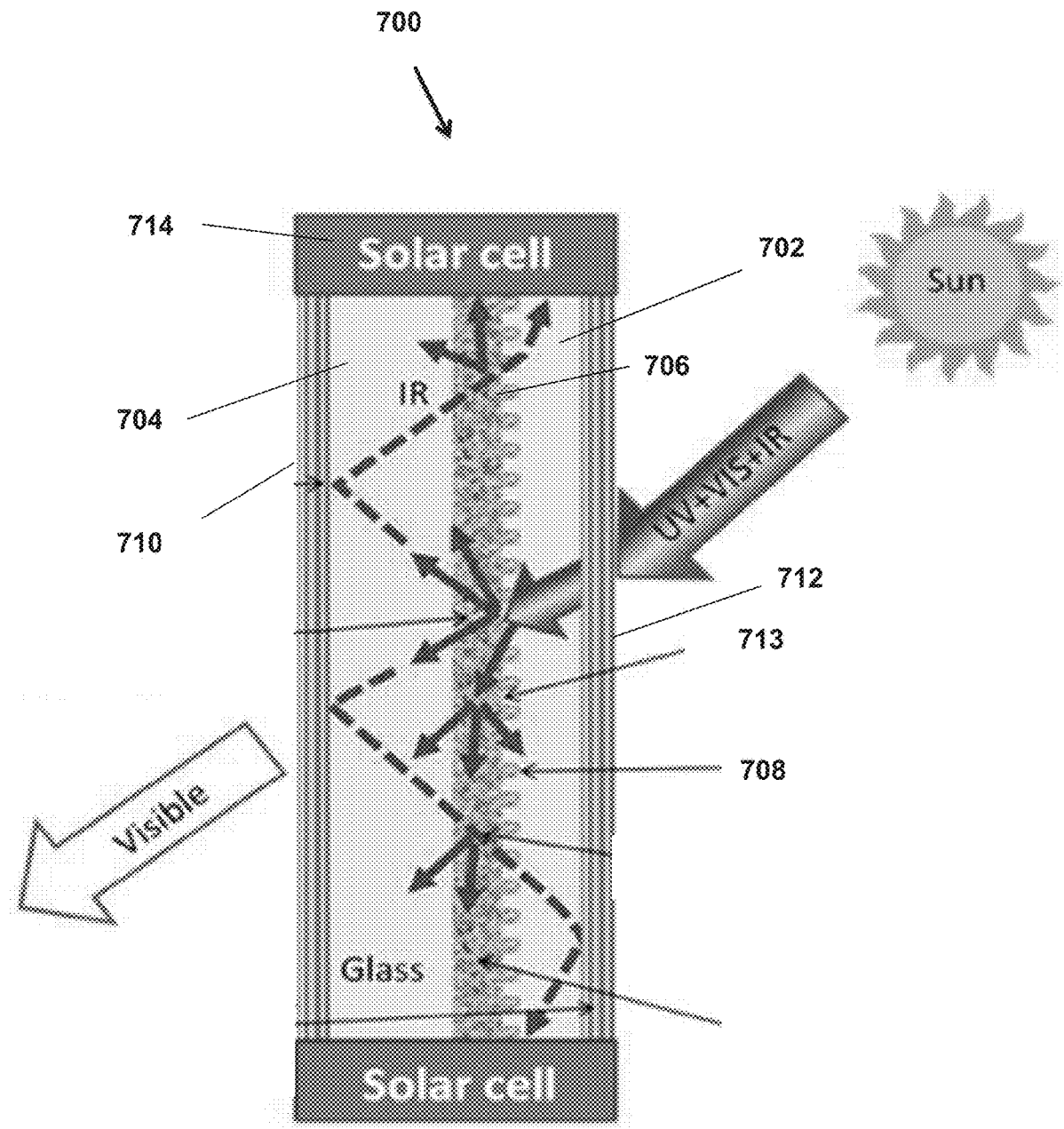

Referring now to FIG. 16, a spectrally selective panel 700 according to an embodiment of the present invention is now described. The spectrally selective panel 700 may replace the spectrally selective panel 104 and photovoltaic elements 106 described above with reference to FIG. 1. The spectrally selective panel 700 reduces transmission of light having a wavelength in an IR wavelength band while being largely transmissive for visible light and is arranged to divert IR light and use the diverted IR light for generation of electrical energy. In a variation of this embodiment the panel 700 may reduce transmission of IR and visible light and direct IR and visible light to edges of the selective panel 700.

The spectrally selective panel 700 comprises in this embodiment glass panels 702 and 704. A diffractive element 706 is provided on a face of the glass panel 702. The glass panels 702 and 704 are spaced apart by a gap filled with a material 708 that functions as an adhesive as well as transparent matrix into which the scattering and/or luminescent materials are incorporated thus making it a composite functional material.

Exterior surfaces of the panels 702 and 704 are coated with multilayer coatings 712 and 710, respectively.

Photovoltaic elements 714 are positioned at side portions of the spectrally selective panel 700 and are supported by a frame structure (not shown), which is similar to the frame structure 102 described above with reference to FIGS. 1 to 9.

The diffractive element 706 is arranged for spectrally deflecting of incident and reflected IR and/or visible light, and for transmission of visible light. In this particular example, the diffractive element 706 is a transmission-mode blazed diffraction grating and is designed such that the majority of the incident solar (IR) light is deflected into a single preferential order of diffraction, with the grating design features optimized for the light incidence angle that is governed by the expected typical mid-day solar radiation incidence angle onto window surfaces. A person skilled in the art will appreciate that the diffractive element 706 can also be operated in reflection-mode as well as being designed to deflect predominantly within the IR spectral range into a multiplicity of transmitted and/or reflected diffraction orders.

Spectral properties of the diffractive element 706 can be designed by those skilled in the art by adjusting the following parameters: refractive index, grating profile shape, blaze angle, duty cycle, grating period, number of phase levels and etching depth(s). In this particular example, the diffractive optical element 706 comprises a plurality of grooves 713, each groove having a distance in the range of 4 μm to an adjacent groove (grating period).

The plurality of grooves 713 and the gap between the glass panels 702, 704 are filled with the material 708. The material 708 is a luminescent scattering powder comprising an epoxy. The material 708 provides adhesive, luminescence and also scattering functions. The scattering of incident light by the luminescent scattering powder increases a portion of the light that is directed towards side portions of the panel 700.

Light that is incident from a transversal direction of the spectrally selective panel may be absorbed by the luminescent material resulting in emission of luminescence radiation that is emitted in random directions. This results in radiation that is less transversely oriented than the incident radiation and consequently facilitates direction of light towards side portions of the glass panels 702 and 704 towards the solar cells 714 for generation of electrical energy.

A person skilled in the art will appreciate that the glass panels 702 and 704 may also be doped with luminescent materials that absorb a portion of the incoming IR, visible and UV light and emit luminescent radiation in random directions.

The coating 710 is a multilayer coating and is in this embodiment arranged to reflect incident IR light within a wide IR wavelength band. The coating 710 will be described in detail further below.

A portion of IR light that is reflected by the layer 710 in a transversal direction is scattered by the material 708 such that corresponding light intensity is directed by multiple scattering and/or internal reflection towards the solar cells 714. Consequently, the scattering properties of the material 708 facilitate reduction of throughput of IR radiation and efficiency of energy generation.

The top coating 712 can have either the anti-reflective properties in the UV and visible wavelength ranges—in order to use as much incident UV energy within the panel structure as is available, and therefore excite a range of inorganic luminophores, or alternatively it can have high-reflection properties in the UV and also anti-reflection properties across the visible wavelength range and at the same time functions as a partial IR reflector. The visible-range antireflection properties can also be adjusted by design to minimize reflection of the incident light energy within a particular range of incidence angles. In another embodiment, the top coating 712 is arranged to be highly-reflective for the UV radiation whilst being antireflective for the visible light and optionally also highly-reflective within an IR wavelength (sub)-band within which the luminophore materials emit light. The high-reflectivity property in the UV band is in this example used to protect the luminophores from being adversely affected by the incident UV radiation.

The multi-layered structures 610, 710 will now be described in further detail. These coatings are optical interference coatings and are arranged to reflect incident IR radiation. A person skilled in the art will appreciate that in a variation of this embodiment the optical interference coatings may also be arranged such that the multi-layered structure reflects visible light, or IR and visible light.

In this example the multi-layered structure is of a metal-dielectric edge-filter design type. The multi-layered structure may comprise one or more stacks of layers (optical interference coatings).

In this embodiment the multi-layered structures 610, 710 are arranged such that the fraction of total integrated solar-IR radiation power contained within the wavelengths range of 700-1700 nm and that transmits optically only approximately 4%. In an alternative embodiment the multi-layered structure may for example also comprise a sequence of layers that result in low thermal emissivity properties and may have solar control functions.

The multi-layered structures 610, 710 have in this embodiment also a high reflectivity (>90% or even >98%) of solar radiation across a wide UV band of solar radiation within the general limits between 300-410 nm. The multi-layered structures 110 and 710 may be formed from metallic and dielectric materials. Alternatively, the multilayered structures may be formed exclusively form dielectric materials. The multi-layered structures 610, 710 may alternatively also be arranged to have different reflective properties, and may be reflective for a portion of visible light (especially for applications in which the panel 600, 700 is used to provide light for illumination of interior spaces).

The following will summarise the design of a particular example of the multi-layered structures 610, 710. The multi-layered structure is in this example a multiple stack edge mirror that comprises layers of dielectric materials. Each of say 3 stacks comprises typically more than 10 component layers. Layer properties may be calculated as follows using a suitable software routine and a high-performance Needle Optimization or Random Optimization, or Genetic algorithms, for example:

$$S\{a\}(L/2HL/2)^m\{b\}(L/2HL/2)^n\{c\}(L/2HL/2)^p\{d\}(LMHML)^q$$

with S identifying the location of the substrate with respect of film sequence and L, H and M denoting the quarter-wave optical thickness layers of the corresponding materials. The design wavelength in each set of brackets is varied according to the preceding multiplication factor in the "{ }" brackets, with respect to a base design wavelength. For example for a design wavelength of 500 nm, the optical layer thicknesses in the sub-stack {2.0}(HLM)10 is calculated as being 1000 nm for all layers within that sub-stack within the "( )" brackets. Consequently, the physical thickness of each the layer "H" is 1000 nm/(4*n(H)). The aim of the optimization algorithm is to minimise sub-stack repetition indices m, n, p, and q as well as minimise the total thickness and layer number required to achieve the desired spectral response shape for any given application. Another goal is to optimize the local (sub-stacks) individual design-wavelength multiplication factors a, b, c, and d. If desired, in any additional layers may be inserted into the sequence of layers, in between sub-stacks or any index-matching layers in order to further adjust a resultant performance and spectrum the multi-layered structure 610, 710.

An example of one embodiment of this design approach is provided in the following:

$$S\{2.11\}(L/2HL/2)^{12}\{1.64\}(L/2HL/2)^{8}\{2.85\}(L/2HL/2)^{8}\{1.4\}(LMHML)^{1}$$

A (base) design wavelength of 500 nm was used for the optimisation and the materials used were $Ta_2O_5$, $Al_2O_3$ and $SiO_2$. 61 layers in the deposition sequence (thickness ¼ of the wavelength of the radiation), total thickness of coating shown in this example is 9.4 µm.

Both the low-wavelength and the high-wavelength transmission slopes can be shifted spectrally and thus the slope locations can be controlled, through adjusting the design sequence and individual layer thicknesses. The high-transmission band is shifted towards the green-red region in this example, as well as a rather narrow short-wave-rejection band results from this example design.

A person skilled in the art will appreciate that the multi-layered structure may take various different forms and may comprise a sequence of layers of both dielectric and metallic materials. Alternatively the multi-layered structure may comprise exclusively dielectric materials.

Although the invention has been described with reference to particular examples, it will be appreciated by those skilled in the art that the invention may be embodied in many other forms. For example, a device such as device 100 may also comprise a mirror that is supported by a support of the frame 102 of the device. The mirror may be located at or in the proximity of a side portion or an edge of the spectrally selective panel 104. At least a portion of IR light that is incident on the spectrally selective panel 104 is directed towards the photovoltaic elements 106 via the mirror.

The invention claimed is:

1. A window for a building, the window comprising:
    a panel including two exterior surfaces of the window, the two exterior surfaces separated by a volume of the panel, wherein the panel is at least partially transmissive for visible light, wherein the two exterior surfaces includes a receiving surface for receiving incident light and being arranged such that a portion of the incident light is redirected towards regions that are at edges of the panel;
    a plurality of photovoltaic elements comprising a first and a second photovoltaic element positioned at the same edge of the panel,
        the first photovoltaic element being substantially perpendicular to the second photovoltaic element and substantially parallel to the edge of the panel,
        the second photovoltaic element being positioned parallel below and oriented along the receiving surface of the panel to receive light that is redirected through the area in the proximity of the edge,
        the first photovoltaic element facing the edge and being positioned to receive light that is redirected through the edge,
        the first photovoltaic element having a width that is larger than a thickness of the panel and being positioned such that at least a portion of light that is guided towards the edge of the panel, but is scattered out of the panel in the proximity of the edge, is collected by the first photovoltaic element; and
    an electrical component comprising a battery,
    wherein the window is arranged to charge the battery using electric energy generated by the first and second photovoltaic elements, and
    wherein the window is arranged to generate the electricity from at least a portion of the redirected light.

2. The window of claim 1 wherein the electrical component further comprises a light source that can be used to supplement illumination using electrical energy provided directly or indirectly by the first and second photovoltaic elements.

3. The window of claim 2 wherein the window is arranged for night time illumination using the light source and electric energy provided by the battery that is charged during daytime.

4. The window of claim 2 wherein the light source is an LED light source.

5. The window of claim 1 wherein the electric component further comprises a transformer that is arranged to receive an output from the first and second photovoltaic elements.

6. The window of claim 5 wherein a transformed output is accessible via a socket.

7. The window of claim 1 comprising a voltage regulator.

8. The window of claim 1 comprising an inverter.

9. The window of claim 1 wherein the first and second photovoltaic elements are electrically parallel connected to each other.

10. The window of claim 1 comprising a frame structure for supporting the panel at an edge or side portion of the panel.

11. The window of claim 10 wherein the window comprises at least one further photovoltaic element that is positioned on the frame structure or on the panel and arranged to collect incident light that is directed towards the frame structure.

12. The window of claim 10 comprising at least one coupling for coupling to external electric windows and wherein the at least one coupling is positioned at a surface portion of the frame structure such that the at least one coupling is accessible from a location outside the window.

13. The window of claim 1, wherein the second photovoltaic element is positioned only along one edge of the panel and does not extend across an entirety of the panel.

14. A window for a building, the window comprising:
    a panel including two exterior surfaces of the window, the two exterior surfaces separated by a volume of the panel, wherein the panel is at least partially transmissive for visible light, wherein the two exterior surfaces includes a receiving surface for receiving incident light and being arranged such that a portion of the incident light is redirected towards regions that are at edges of the panel;
    a plurality of photovoltaic elements comprising a first and a second photovoltaic element positioned at the same edge of the panel,
        the first photovoltaic element being substantially perpendicular to the second photovoltaic element and substantially parallel to the edge of the panel,
        the second photovoltaic element being positioned parallel below and oriented along the receiving surface of the panel to receive light that is redirected through the area in the proximity of the edge, the first photovoltaic element facing the edge and being positioned to receive light that is redirected through the edge, the first photovoltaic element having a width that is larger than a thickness of the panel and being positioned such that at least a portion of light that is guided towards the edge of the panel, but is scattered out of the panel in the proximity of the edge, is collected by the first photovoltaic element; and an electrical component comprising a transformer that is arranged to receive an output from the first and second photovoltaic elements, wherein the window is arranged to generate the electricity from at least a portion of the redirected light.

15. The window of claim 14 wherein a transformed output is accessible via a socket.

16. The window of claim 14 further comprising a voltage regulator.

17. The window of claim 14 further comprising an inverter.

18. A system comprising a plurality of windows in accordance with claim 1, the windows being electrically parallel connected.

19. The system of claim 18 comprising at least one electrical coupling electrically interconnecting the plurality of the windows in a modular manner.

20. The system of claim 18 comprising a plurality of diodes that is arranged to control a direction of a flow of a current generated by the at least one photovoltaic element of each window such that an adverse influence of a direction of current flow in a portion of the device on an output of the window is reduced.

* * * * *